(12) United States Patent
Hwang et al.

(10) Patent No.: US 12,308,317 B2
(45) Date of Patent: May 20, 2025

(54) SEMICONDUCTOR DEVICE AND METHOD FOR FABRICATING THE SAME

(71) Applicant: SK hynix Inc., Gyeonggi-do (KR)

(72) Inventors: Se Ra Hwang, Gyeonggi-do (KR); Jun Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 604 days.

(21) Appl. No.: 17/399,430

(22) Filed: Aug. 11, 2021

(65) Prior Publication Data
US 2022/0208687 A1    Jun. 30, 2022

(30) Foreign Application Priority Data

Dec. 30, 2020  (KR) ........................ 10-2020-0188120

(51) Int. Cl.
*H01L 21/768* (2006.01)
*H01L 23/522* (2006.01)
*H01L 23/532* (2006.01)

(52) U.S. Cl.
CPC .. *H01L 23/53223* (2013.01); *H01L 21/76802* (2013.01); *H01L 21/76843* (2013.01); *H01L 23/5226* (2013.01)

(58) Field of Classification Search
CPC ......... H01L 23/53223; H01L 21/76802; H01L 21/76843; H01L 23/5226; H01L 23/5286; H01L 21/76898; H01L 21/823871; H01L 23/49822; H01L 23/535
See application file for complete search history.

(56) References Cited

U.S. PATENT DOCUMENTS

| | | | |
|---|---|---|---|
| 2006/0189129 A1* | 8/2006 | Baskaran | C25D 3/02 257/E21.174 |
| 2010/0224922 A1* | 9/2010 | Shinhara | H01L 21/3105 257/411 |
| 2013/0147022 A1* | 6/2013 | Yoon | H01L 23/3192 257/637 |
| 2019/0157214 A1* | 5/2019 | Kim | H01L 21/7682 |
| 2019/0312035 A1* | 10/2019 | Takuma | H01L 23/5283 |
| 2020/0058862 A1* | 2/2020 | Howard | H10N 70/011 |
| 2020/0235157 A1* | 7/2020 | Kodaira | H04N 25/70 |
| 2021/0111089 A1* | 4/2021 | Liu | H01L 23/3192 |
| 2021/0249365 A1* | 8/2021 | Liu | H01L 23/3192 |
| 2023/0209828 A1* | 6/2023 | Zhang | H10B 43/50 257/314 |

* cited by examiner

*Primary Examiner* — Tucker J Wright
*Assistant Examiner* — David W Ward
(74) *Attorney, Agent, or Firm* — IP & T GROUP LLP

(57) ABSTRACT

A semiconductor device includes a substrate; multi-level interconnections disposed on the substrate; a first passivation layer containing hydrogen and covering top interconnections among the multi-level interconnections; a second passivation layer disposed over the first passivation layer to prevent out-diffusion of the hydrogen from the first passivation layer; an in-line top dielectric layer over the second passivation layer; an in-line redistribution layer connected to one among the top interconnections by passing through the in-line top dielectric layer, the second passivation layer, and the first passivation layer; and a hydrogen blocking liner disposed between the in-line redistribution layer and the first passivation layer.

8 Claims, 13 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2020-0188120, filed on Dec. 30, 2020, which is incorporated herein by reference in its entirety.

TECHNICAL FIELD

Various embodiments of the present disclosure relate to a semiconductor device and a method for fabricating the same and, more particularly, to a semiconductor device including a hydrogen passivation layer and a method for fabricating the same.

BACKGROUND

A method for fabricating a semiconductor device requires various processes, such as an etching process, which may cause damage on the surface of the semiconductor substrate. The damage on the semiconductor substrate surface may increase with increasing integration density of a semiconductor device, because the distance between patterns decreases. This, in turn, may cause an increase in dangling silicon bonds in the silicon material used in the semiconductor substrate. The increase in dangling bonds may become a source of leakage current of a charge, causing a leakage current from a transistor.

SUMMARY

Various embodiments of the present invention include a semiconductor device capable of improving an efficiency of a hydrogen passivation and a method for fabricating the same.

In an embodiment, a semiconductor device includes: a substrate; multi-level interconnections disposed on the substrate; a first passivation layer containing hydrogen and covering top interconnections among the multi-level interconnections; a second passivation layer disposed over the first passivation layer to prevent out-diffusion of the hydrogen from the first passivation layer; an in-line top dielectric layer over the second passivation layer; an in-line redistribution layer connected to one among the top interconnections by passing through the in-line top dielectric layer, the second passivation layer, and the first passivation layer; and a hydrogen blocking liner disposed between the in-line redistribution layer and the first passivation layer.

In another embodiment, a method for fabricating a semiconductor device includes: forming multi-level interconnections over a substrate which includes a device layer; forming a first passivation layer containing hydrogen and covering top interconnections among the multi-level interconnections; forming a second passivation layer to prevent out-diffusion of the hydrogen from the first passivation layer; forming an in-line top dielectric layer over the second passivation layer; forming a through-hole passing through the in-line top dielectric layer, the second passivation layer, and the first passivation layer, thereby exposing the top interconnections; forming a hydrogen blocking liner on a sidewall of the through-hole, the hydrogen blocking liner preventing the out-diffusion of the hydrogen from the first passivation layer; and forming an in-line redistribution layer inside the through-hole where the hydrogen blocking liner is formed.

In another embodiment, a method for fabricating a semiconductor device includes: performing an in-line process that includes forming multi-level interconnections over a substrate containing a device layer, forming a hydrogen passivation layer covering top interconnections of the multi-level interconnections and forming an in-line redistribution layer passing through the hydrogen passivation layer; and performing a package process that includes forming a post-fab conductive layer connected to the in-line redistribution layer; wherein the in-line process further includes forming a hydrogen blocking liner between the in-line redistribution layer and a hydrogen passivation layer.

The disclosed technology may decrease a leakage current by removing a dangling bond by a hydrogen-containing passivation layer. Specifically, the technology can improve a characteristic of a gate-induced drain leakage in dynamic random-access memory (DRAM).

The disclosed technology may improve hydrogen passivation efficiency by forming a hydrogen blocking layer and a hydrogen blocking liner, which prevents out-diffusion of hydrogen at a hydrogen-containing passivation layer.

DETAILED DESCRIPTION

Figure 1:
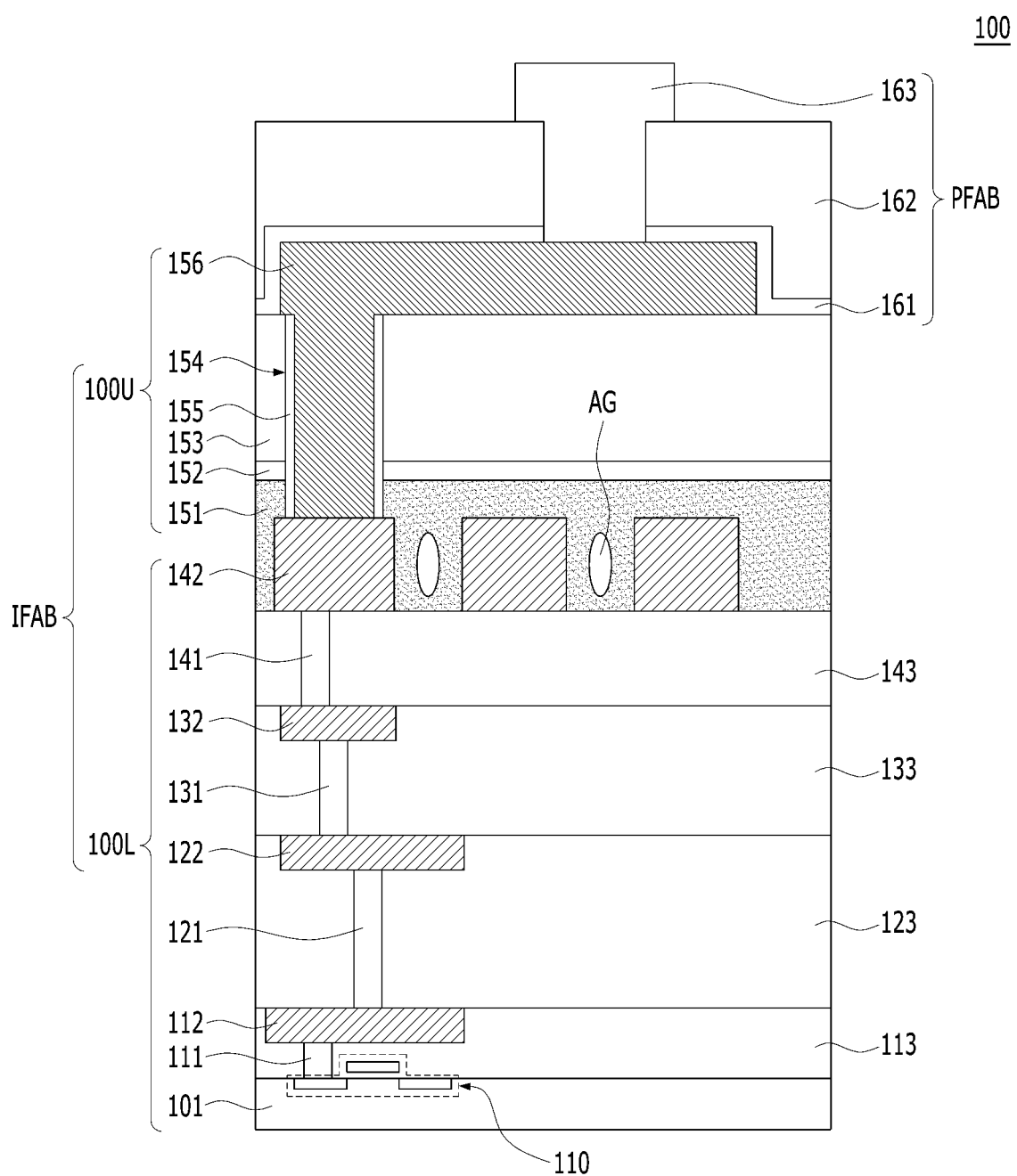
FIG. 1 is a cross-sectional view illustrating a semiconductor device in accordance with an embodiment of the present disclosure.

Various embodiments described herein will be described with reference to cross-sectional views, plane views and block diagrams, which are ideal schematic views of the present invention. Thus, the structures of the drawings may be modified by fabricating techniques and/or tolerances. The embodiments of the present invention are not limited to the specific structures shown in the drawings, but include any changes in the structures that may be produced according to the fabricating process. Accordingly, the regions and the shapes of the regions illustrated in the drawings are intended to illustrate specific structures of regions of the elements, and are not intended to limit the scope of the invention.

Terms used herein are for describing the embodiments and are not intended to limit the present disclosure. In the present specification, a singular expression includes a plural expression unless the context clearly indicates otherwise. "Comprises" and/or "comprising" used herein do not preclude the existence or the possibility of adding one or more elements other than those mentioned. In addition, in the present specification, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
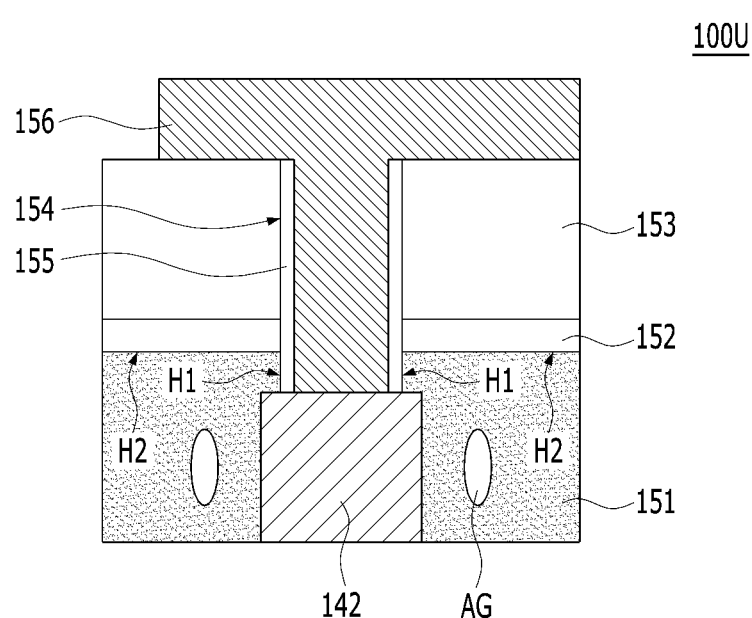
FIG. 2 is a detailed diagram illustrating an upper portion of the semiconductor device shown in FIG. 1.

FIG. 1 is a cross-sectional view illustrating a semiconductor device in accordance with an embodiment of the present disclosure. FIG. 2 is a detailed diagram illustrating an upper portion of the semiconductor device shown in FIG. 1.

Referring to FIGS. 1 and 2, a semiconductor device 100 may include an in-line fab structure IFAB and a post-fab structure PFAB over the in-line fab structure IFAB. The in-line fab structure IFAB is a structure formed in an in-line process. The post-fab structure PFAB is a structure formed in a package process. The in-line fab structure (IFAB) may include a lower structure 100L and an upper structure 100U positioned directly over the lower structure 100L.

The lower structure 100L may include a substrate 101, a device layer 110, a plurality of interconnections 112, 122, 132, and 142, and a plurality of interlayer insulation layers 113, 123, 133, and 143. The lower structure 100L may further include a plurality of contact plugs 111, 121, 131, and 141. The plurality of contact plugs 111, 121, 131, and 141 may also be referred to as via plugs. The plurality of interlayer insulation layers 113, 123, 133, and 143 may include, for example, silicon oxide, silicon nitride, low-k materials, or combinations thereof. The plurality of interconnections 112, 122, 132, and 142 and the plurality of contact plugs 111, 121, 131, and 141 may include for example, metal, metal nitride, metal silicide, or combinations thereof. The plurality of interconnections 112, 122, 132, and 142 may include, for example, tungsten, copper, aluminum, or combinations thereof. The plurality of contact plugs 111, 121, 131, and 141 may include, for example, tungsten, copper, titanium nitride, or combinations thereof. The plurality of interconnections 112, 122, 132, and 142 may also be referred to as multi-level interconnections. The interconnections 142 as top (also referred to as uppermost or top interconnections 142) interconnections among the plurality of interconnections 112, 122, 132, and 142 may also be referred to as a top metal layer or top metal pads. The interconnections 112, 122, and 132 may be a metal line and the top interconnections 142 may be metal pads. The device layer 110 may include a transistor, a bit line, and a capacitor. In the embodiment of the present invention, the device layer 110 may include a transistor.

The upper structure 100U may include insulation materials 151, 152, and 153 and an in-line redistribution layer 156. The upper structure 100U may further include a hydrogen blocking liner 155 which surrounds a sidewall of the in-line redistribution layer 156. The in-line redistribution layer 156 may be electrically connected to one among the top interconnections 142 by passing through the insulation materials 151, 152, and 153. For example, the in-line redistribution layer 156 may fill a through-hole 154 that passes through the insulation materials 151, 152, and 153. The hydrogen blocking liner 155 may be formed on a sidewall of the through-hole 154. The top interconnections 142 may include a plurality of interconnections disposed at the same level. Air gaps AG may be formed between top interconnections 142. A parasitic capacitance between the top interconnections 142 is reduced by the air gaps AG.

The insulation materials 151, 152, and 153 may include a stack of a first passivation layer 151, a second passivation layer 152, and an in-line top dielectric layer 153. The second passivation layer 152 may have an etching selectivity with respect to the first passivation layer 151 and the in-line top dielectric layer 153. The first passivation layer 151 and the in-line top dielectric layer 153 may be made of a same material. The second passivation layer 152 may be made of a different material than the first passivation layer 151 and the in-line top dielectric layer 153. The first passivation layer 151 and the in-line top dielectric layer 153 may include, for example, silicon oxide. The second passivation layer 152 may include, for example, silicon nitride. The second passivation layer 152 may be thinner than the first passivation layer 151 and the in-line top dielectric layer 153. The in-line top dielectric layer 153 may be thicker than the first and second passivation layers 151 and 152.

The first passivation layer 151 may have a step coverage or a conformality that can provide the air gaps AG disposed between the top interconnections 142. The first passivation layer 151 may include, for example, silicon oxide and hydrogen. The first passivation layer 151 may include high density plasma oxide (HDP Oxide) containing hydrogen. The first passivation layer 151 may include a hydrogen-rich layer including a large amount of hydrogen. For example, a concentration of hydrogen in the first passivation layer 151 may be range from 20 at % to 40 at %. The first passivation layer 151 may include, for example, a hydrogen-containing silicon oxide in which the air gaps AG is embedded.

The in-line top dielectric layer 153 may be referred to as an inline-RDL (iRDL) mold or an iRDL insulation material. The in-line top dielectric layer 153 may include silicon oxide without hydrogen or silicon oxide containing hydrogen. The in-line top dielectric layer 153 may not include a material such as polyimide.

The second passivation layer 152 may prevent out-diffusion of hydrogen. The second passivation layer 152 may fully cover the first passivation layer 151. In an embodiment, the second passivation layer 152 may include silicon nitride, which may be formed by a chemical vapor deposition process.

The in-line redistribution layer 156 may include, for example, aluminum. A portion of the in-line redistribution layer 156 may be extended to an upper surface of the in-line top dielectric layer 153. The hydrogen blocking liner 155 may include silicon nitride.

In accordance with an embodiment shown in FIG. 1, the substrate 101, the lower structure 100L, and the upper structure 100U may be formed in an inline-FAB (IFAB) process. For example, the in-line redistribution layer 156 may be formed before a package process. The post-fab structure PFAB may be formed over the in-line redistribution layer 156 in a package process. The post-fab structure PFAB may include a protection layer 161, a protection insulation layer 162, and a post-fab conductive layer 163. The post-fab conductive layer 163 may be connected to the in-line redistribution layer 156 by passing through the protection insulation layer 162 and the protection layer 161. The post-fab conductive layer 163 may include solder ball or bump. The in-line redistribution layer 156, formed in an in-line process, may be referred as an in-line redistribution layer (inline-RDL). In comparison, a conventional redistribution layer (conventional RDL) is formed after an in-line process and is different from the in-line redistribution layer 156 in accordance with the embodiment of the present invention. In an embodiment, the inline-RDL may be located as an uppermost material of DRAM.

According to an embodiment of the present invention, out-diffusion of hydrogen (refer to H1 in FIG. 2) from the first passivation layer 151 may be prevented by forming the hydrogen blocking liner 155. The second passivation layer 152 may also prevent the out-diffusion of hydrogen (refer to H2 from FIG. 2) from the first passivation layer 151.

In accordance with an embodiment of the present invention, the hydrogen blocking liner 155 may prevent an exposure of the sidewalls of the through-hole 154. In other words, the hydrogen blocking liner 155 may prevent an exposure of the sidewalls of the first and second passivation layers 151 and 152.

FIGS. 3A to 3G are cross-sectional views illustrating a method for fabricating a semiconductor device in accordance with an embodiment of the present invention.

Figure 3A:
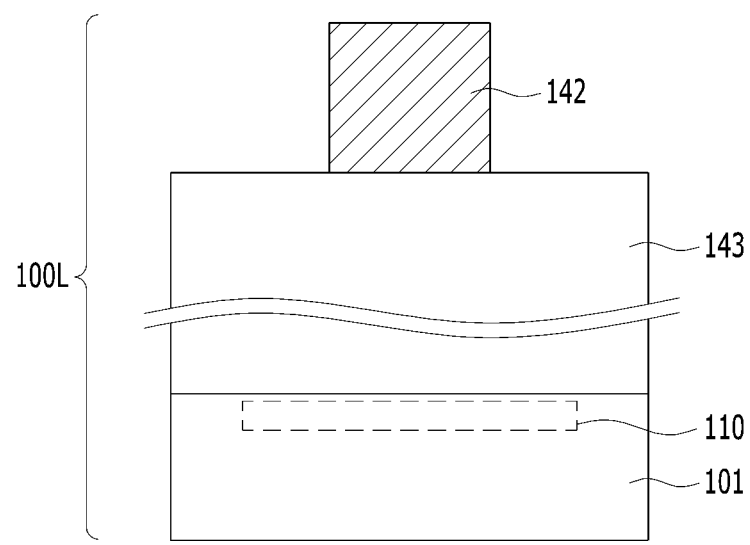
FIGS. 3A to 3G are cross-sectional views illustrating a method for fabricating a semiconductor device in accordance with an embodiment of the present invention.

As illustrated in FIGS. 1 and 3A, the lower structure 100L may be formed over the substrate 101. The lower structure 100L may include the device layer 110. The device layer 110 may include at least one of a transistor, a bit-line, and a capacitor. In the present embodiment, the device layer 110 may include a transistor. The lower structure 100L may include portions of a DRAM. The lower structure 100L may include the plurality of interconnections 112, 122, 132, and 142, the plurality of interlayer insulation layers 113, 123, 133, and 143, and the plurality of contact plugs 111, 121, 131, and 141. The interlayer insulation layers 123, 133, and 143 among the plurality of interlayer insulation layers 113, 123, 133, and 143 may be referred to as an inter-metal dielectric layer IMD. The contact plugs 121, 131, and 141 among the plurality of contact plugs 111, 121, 131, and 141 may be referred to as via or via plugs.

A top surface of the lower structure may be formed of the top interconnections 142. The top interconnections 142 may be disposed above the interlayer insulation layer 143. The plurality of interconnections 112, 122, 132, and 142 may be formed by a damascene process or a dual damascene process. The plurality of interconnections 112, 122, 132, and 142 may include a metal such as tungsten, copper, or aluminum. In another embodiment of the present invention, the plurality of interconnections 112, 122, 132, and 142 may be formed by a deposition or an etching of a metal layer.

Figure 3B:
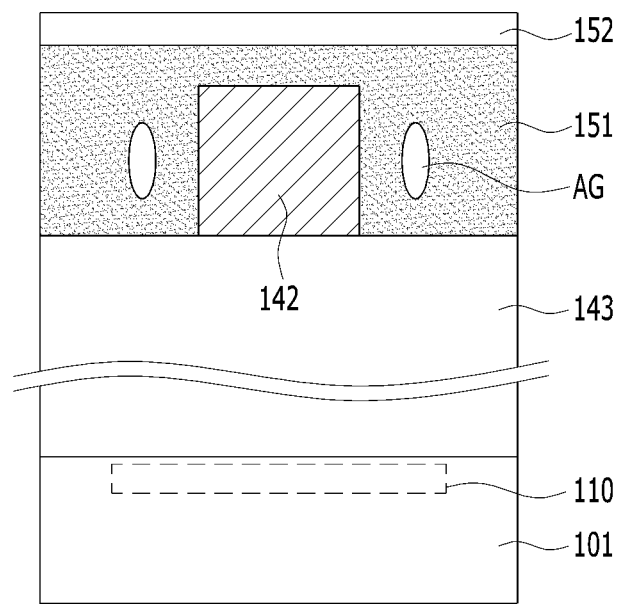

As illustrated in FIG. 3B, the first passivation layer 151 may be formed over the top interconnections 142. The first passivation layer 151 may include a silicon oxide-base material. The first passivation layer 151 may include a hydrogen-rich layer. The first passivation layer 151 may include a hydrogen-containing silicon oxide. The first passivation layer 151 may include a high-density plasma oxide (HDP Oxide). High density plasma oxide (HDP Oxide) may refer to silicon oxide formed by high density plasma deposition. High density plasma oxide (HDP Oxide) may be hydrogen rich.

The first passivation layer 151 may include the air gaps AG between the top interconnections 142. The air gaps AG may be defined between the top interconnections 142 due to a poor step coverage during a formation of the first passivation layer 151. Upper surfaces of the air gaps AG are lower than upper surfaces of the top interconnections 142.

Subsequently, the first passivation layer 151 may be planarized by a process such as a chemical mechanical polishing (CMP) process.

Next, the second passivation layer 152 may be formed over the first passivation layer 151. The second passivation layer 152 and the first passivation layer 151 may be made of different materials. The second passivation layer 152 may be made of a material suitable for preventing out-diffusion of hydrogen. The second passivation layer 152 may include a silicon nitride. The second passivation layer 152 may be thinner than the first passivation layer 151. The first passivation layer 151 may be referred to as a hydrogen-containing passivation layer. The second passivation layer 152 may be referred to as a nitrogen-containing hydrogen blocking layer.

Figure 3C:
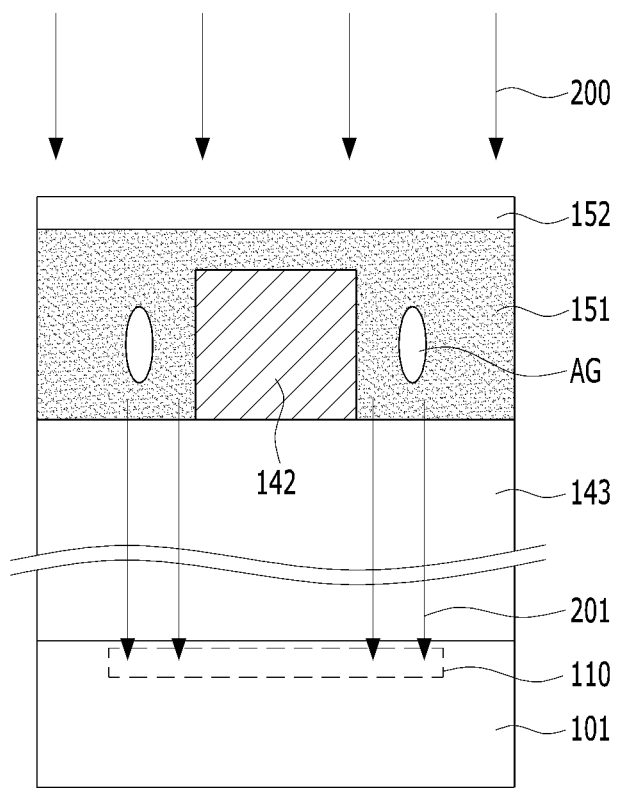

As illustrated in FIG. 3C, an annealing 200 may be performed for hydrogen passivation. The annealing 200 may be performed at an atmosphere of, at least, a hydrogen-containing gas. The annealing 200 may be performed in a mixed atmosphere of hydrogen gas ($H_2$) and nitrogen gas ($N_2$).

During the annealing 200 described above, hydrogen inside the first passivation layer 151 may be diffused and a portion of the device layer 110 may be passivated by hydrogen (refer to the reference numeral 201 of FIG. 3C). Here, the device layer 110 may include at least one of a transistor, a capacitor, and a bit line. A portion of the device layer 110, passivated by hydrogen, may include an interface between a gate insulation layer of a transistor and the substrate 101. A leakage current of a transistor may be reduced by the annealing 200.

Figure 3D:
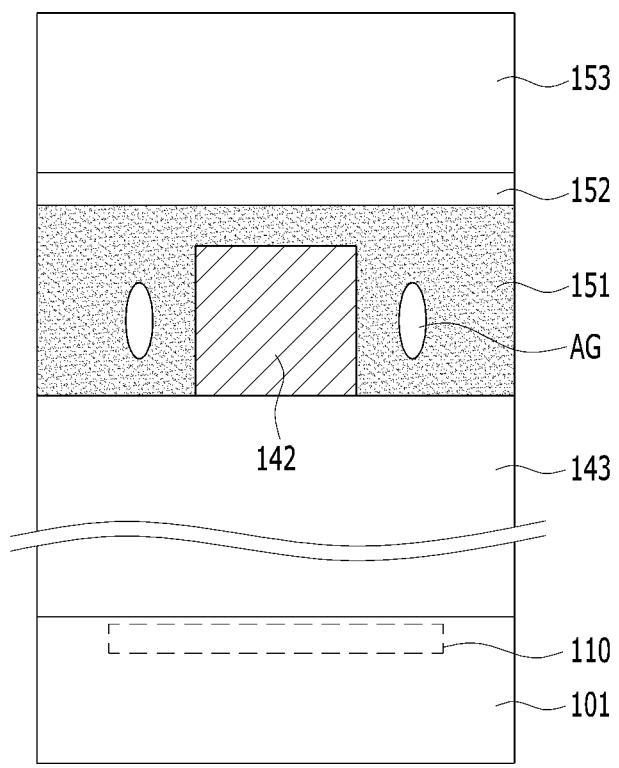

After the annealing 200 is performed, as illustrated in FIG. 3D, the in-line top dielectric layer 153 may be formed over the second passivation layer 152. The in-line top dielectric layer 153 may be made of a different material with the first and second passivation layers 151 and 152. The in-line top dielectric layer 153 may include silicon oxide. The in-line top dielectric layer 153 may have much less hydrogen concentration than the first passivation layer 151. In another embodiment of the present invention, the in-line top dielectric layer 153 may include a hydrogen-free silicon oxide.

Subsequently, the in-line top dielectric layer 153 may be planarized by a process such as a chemical mechanical polishing (CMP) process.

Figure 3E:
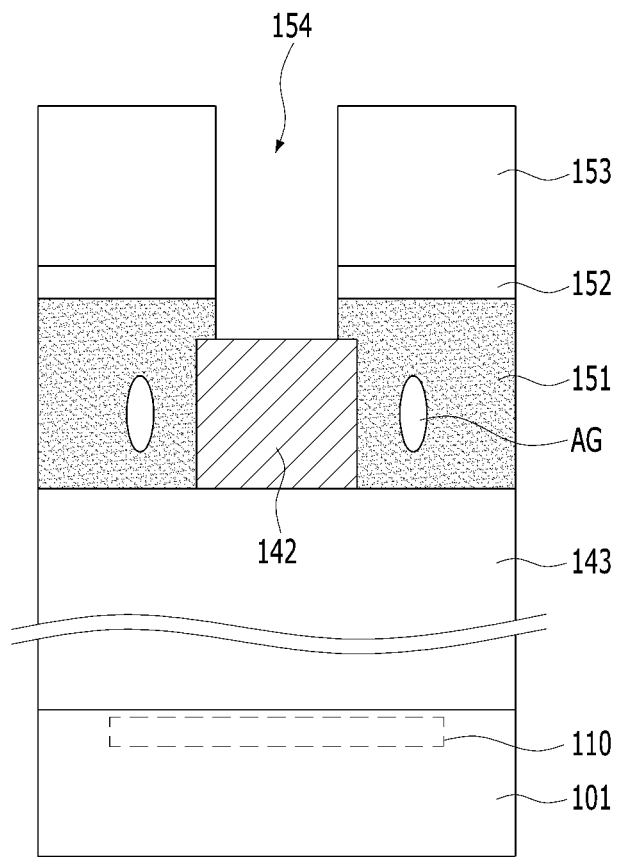

As illustrated in FIG. 3E, the through-hole 154, vertically passing through the in-line top dielectric layer 153, the second passivation layer 152, and the first passivation layer 151, may be formed. A bottom of the through-hole 154 may expose an upper surface of one among the top interconnections 142.

Figure 3F:
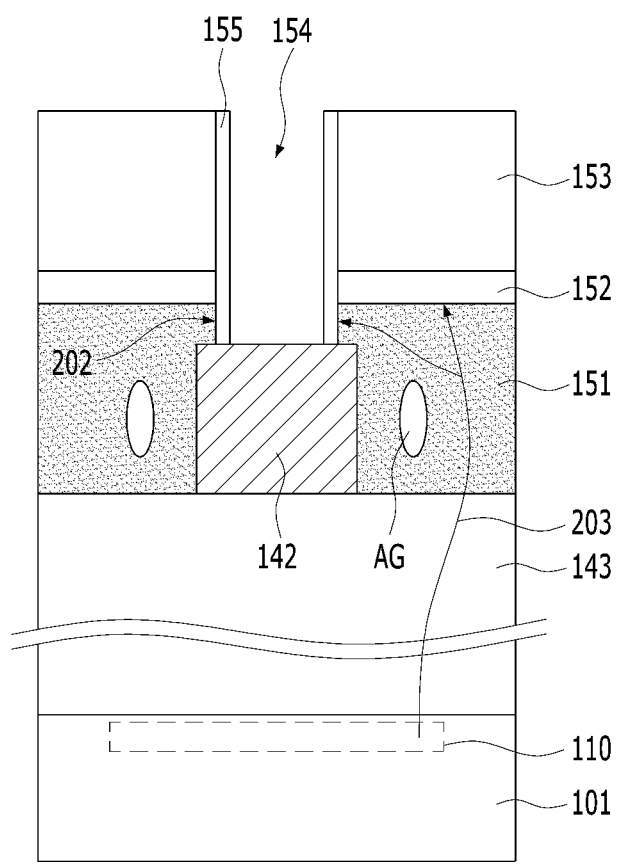

As illustrated in FIG. 3F, the hydrogen blocking liner 155 may be formed on a sidewall of the through-hole 154. The hydrogen blocking liner 155 may include silicon nitride. For example, to form the hydrogen blocking liner, a deposition of silicon nitride and an etch-back process of the deposited silicon nitride may be sequentially performed. The hydrogen blocking liner 155 may, at least, cover a sidewall of the first and second passivation layers 151 and 152.

The hydrogen blocking liner 155 may prevent out-diffusion (refer to the reference numeral 202 of FIG. 3F) of hydrogen from the first passivation layer 151. Also, the hydrogen blocking liner 155 may prevent out-diffusion (refer to the reference numeral 203 of FIG. 3F) of hydrogen depassivated from the device layer 110.

In comparison, hydrogen may be out-diffused from the first passivation layer 151 if the hydrogen blocking liner 155 is not formed. In comparison, the embodiment of the present invention may prevent out-diffusion of hydrogen with the hydrogen blocking liner 155 covering a sidewall of the first passivation layer 151.

Figure 3G:
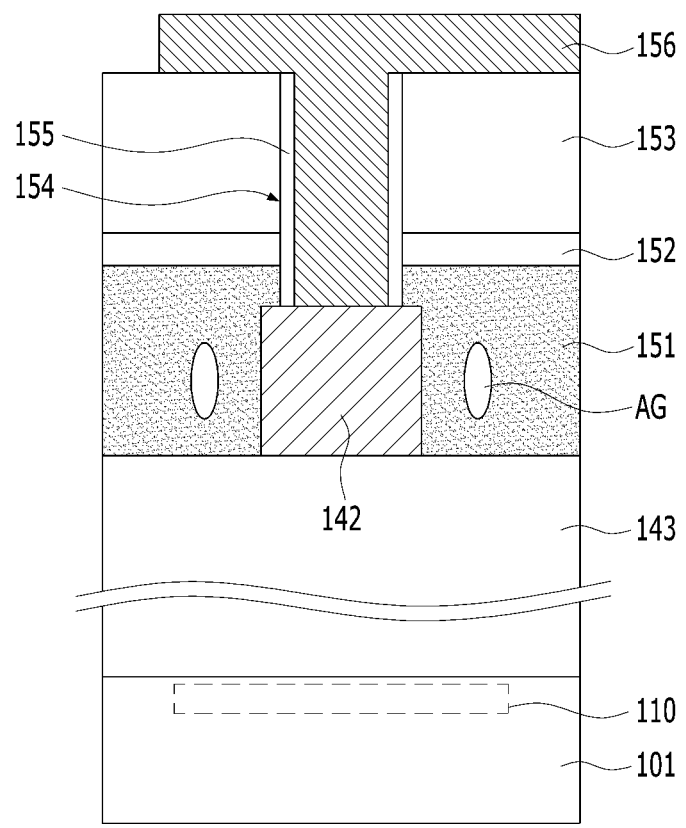

As illustrated in FIG. 3G, the in-line redistribution layer 156 may be formed by depositing and patterning a conductive layer over the hydrogen blocking liner 155. The in-line redistribution layer 156 may be formed by a deposition and an etching of an aluminum layer. The in-line redistribution layer 156 may be electrically connected to one among the top interconnections 142. The in-line redistribution layer 156 may fill the through-hole 154 and be extended to cover the in-line top dielectric layer 153. The hydrogen blocking liner 155 may be disposed between the in-line redistribution layer 156 and the first passivation layer 151. The hydrogen blocking liner 155 may be disposed between the in-line redistribution layer 156 and the second passivation layer 152.

After performing a series of in-line processes as described above, a package process, including the post-fab conductive layer 163 (refer to 163 of FIG. 1) connected to the in-line redistribution layer 156, may be performed. The post-fab conductive layer 163 may include a bump or a solder ball. In another embodiment of the present invention, the package process may further include a formation of a post-redistribution layer. The post-redistribution layer may be formed over the in-line redistribution layer 156. The post-fab conductive layer 163 may include the post-fab conductive layer.

Figure 4:
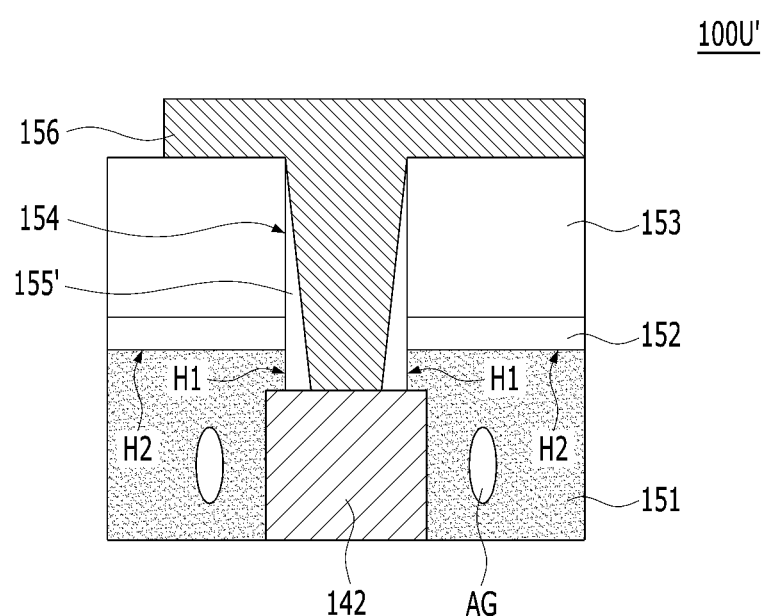
FIGS. 4 to 7 are cross-sectional views illustrating semiconductor devices in accordance with other embodiments of the present invention.
Figure 5:
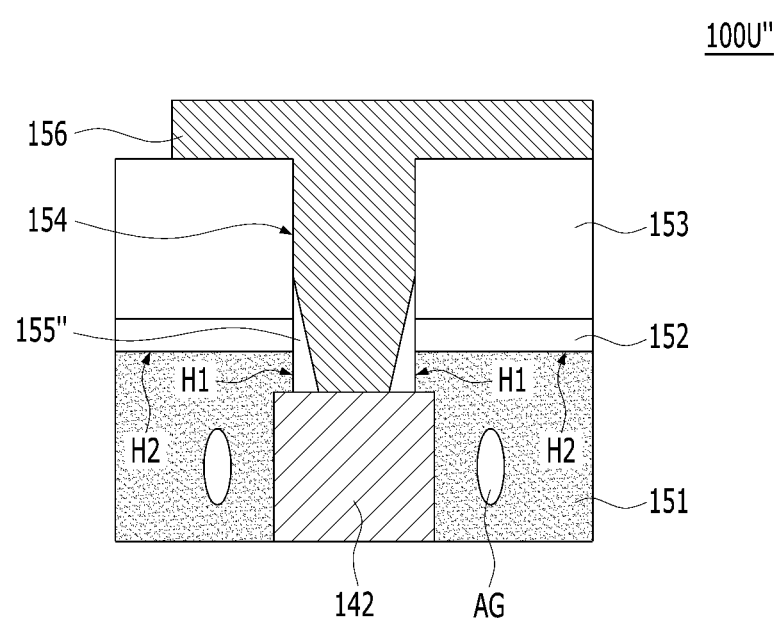

FIGS. 4 and 5 are cross-sectional views illustrating semiconductor devices in accordance with other embodiments of the present invention and describe examples of modified upper structures. Drawings and description of the lower structure as described in FIG. 1 will be omitted herein.

Referring to FIG. 4, an upper structure 100U' may include the first passivation layer 151 covering the top interconnections 142, the second passivation layer 152 over the first passivation layer 151, and the in-line top dielectric layer 153 over the second passivation layer 152 which are covering the top interconnections 142. The upper structure 100U' may further include the through-hole 154 passing through the in-line top dielectric layer 153, the second passivation layers 152 and the first passivation layers 151. The upper structure 100U' may further include the in-line redistribution layer 156 filling the through-hole 154 and connected to one among the top interconnections 142. The upper structure 100U' may further include a hydrogen blocking liner 155' fully covering a sidewall of the in-line redistribution layer 156 filled in the through-hole 154.

The hydrogen blocking liner 155' may include a sloped sidewall. The sloped sidewall may be in direct contact with the in-line redistribution layer 156. The hydrogen blocking liner 155' may have a height covering sidewalls of the first and second passivation layers 151 and 152. The hydrogen blocking liner 155' may include a sloped sidewall and may increase in diameter in a direction toward the top interconnection 142.

Referring to FIG. 5, an upper structure 100U" may include the first passivation layer 151 covering the top interconnections 142, the second passivation layer 152 formed over the first passivation layer 151, and the in-line top dielectric layer 153 over the second passivation layer 152. The upper structure 100U" may further include the through-hole 154 passing through the in-line top dielectric layer 153 and the second and first passivation layers 152 and 151, and the in-line redistribution layer 156 filling the through-hole 154 and connected to one among the top interconnections 142. The upper structure 100U" may further include a hydrogen blocking liner 155" partially covering a sidewall of the in-line redistribution layer 156 filled in the through-hole 154.

The hydrogen blocking liner 155" may include a sloped sidewall. The sloped sidewall may be in direct contact with the in-line redistribution layer 156.

The hydrogen blocking liner 155" shown in FIG. 5 may have a height shorter than the hydrogen blocking liner 155' shown in FIG. 4. The hydrogen blocking liner 155" may have a height covering sidewalls of the first and second passivation layers 151 and 152. An upper surface of the hydrogen blocking liner 155" may be at a lower level than the in-line top dielectric layer 153.

Figure 6:
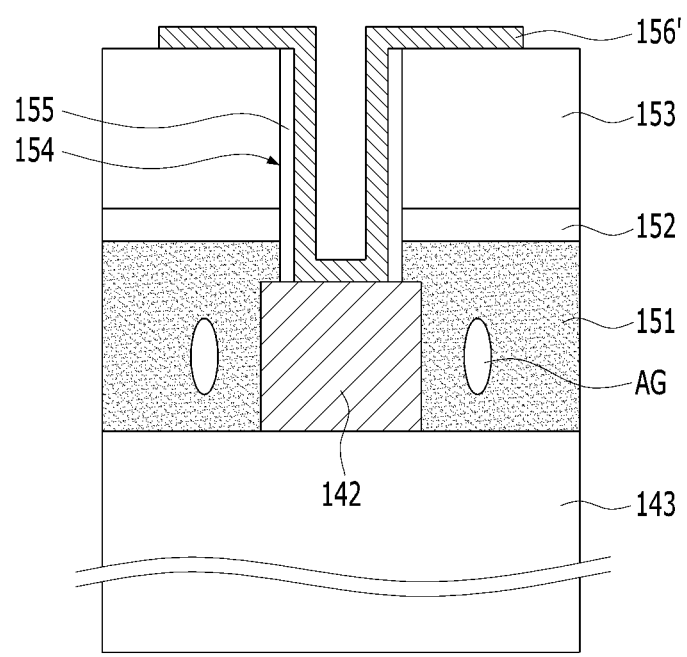

FIG. 6 is a cross-sectional view illustrating a semiconductor device in accordance with another embodiment of the present invention and describes an example of a modified redistribution line layer. Drawings and description of the lower structure as described in FIG. 1 will be omitted herein.

Referring to FIG. 6, a semiconductor device 100U1 may include the first passivation layer 151 covering the top interconnections 142, the second passivation layer 152 formed over the first passivation layer 151, and the in-line top dielectric layer 153 formed over the second passivation layer 152. The top structure 100U1 may include the through-hole 154 passing through the in-line top dielectric layer 153, the second and first passivation layers 152 and 151, and an in-line redistribution layer 156' filling the through-hole 154 and connected to one among the top interconnections 142. The upper structure 100U1 may include the hydrogen blocking liner 155 covering a sidewall of the in-line redistribution layer 156' disposed on the through-hole 154.

In the embodiment of FIG. 6, the in-line redistribution layer 156' may not fill the through-hole 154 and be formed conformally over the hydrogen blocking liner 155.

Figure 7:
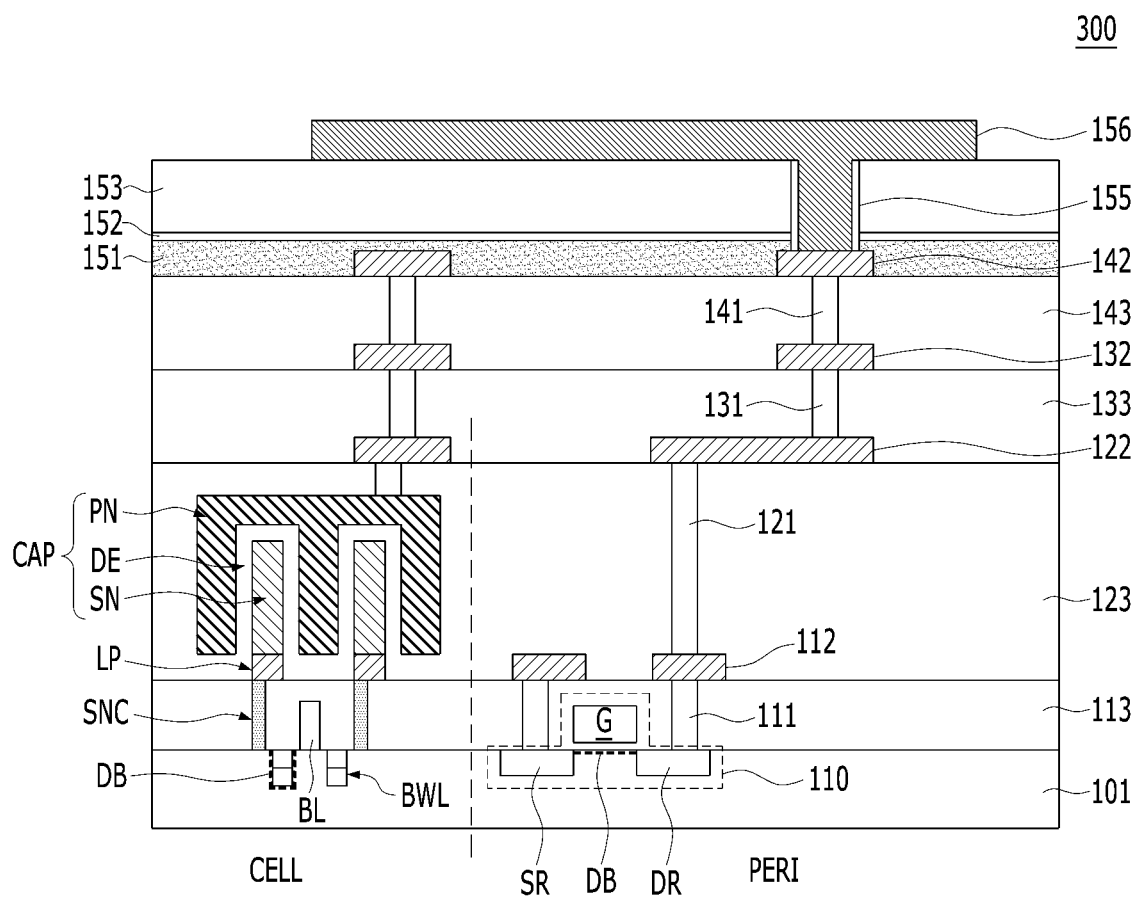

FIG. 7 is a cross-sectional view illustrating a semiconductor device according to an embodiment of the present invention. The semiconductor device shown in FIG. 7 may be, for example, a DRAM.

Referring to FIG. 7, a semiconductor device 300 may include a cell region CELL and a peripheral circuit region PERI. The cell region CELL may include a buried word line BWL, a bit line BL, and a capacitor CAP. The capacitor CAP may include a storage node SN, a dielectric layer DE, and a plate node PN. The storage node SN may be connected to the substrate 101 by a landing pad LP and a storage node contact plug SNC. The plate nod PN may be electrically connected to interconnections 122, 132, and 142 disposed at layers of multiple levels.

The peripheral circuit region PERI may include the device layer 110. The device layer 110 may connect to the in-line redistribution layer 156 by the interconnections 112, 122, 132, and 142 disposed at different layers via the via plugs 111, 121, 131, and 141. The device layer 110 may be a transistor including a gate G, a source SR, and a drain DR.

The cell region CELL and the peripheral circuit region PERI may be covered by a stack of the first passivation layer 151, the second passivation layer 152, and the in-line top dielectric layer 153.

The in-line redistribution layer 156 may be formed before a package process.

The device layer 110, a transistor, of the peripheral circuit region PERI, may include a dangling bond DB disposed on a surface of the substrate 101. The dangling bond DB may be passivated by hydrogen diffused from the first passivation layer 151. Hydrogen may be diffused by the annealing 200 (refer to FIG. 3C), which is performed before a formation of the in-line redistribution layer 156. Thus, a threshold voltage and a leakage current of a transistor may be improved.

Although not illustrated, the dangling bond DB may exist between the buried word line BWL and the substrate 101 in the cell region CELL. The dangling bond DB of the cell region CELL may be passivated by hydrogen diffused from the first passivation layer 151.

As above, a leakage current may be reduced by removing the angling bond DB by the first passivation layer 151 which is hydrogen-rich. Thus, a characteristic of a gate-induced drain leakage in DRAM may be improved.

Also, a hydrogen passivation efficiency may be improved by forming the hydrogen blocking liner 155 which prevents a hydrogen out diffusion.

The above-described invention is not limited by the embodiments described or figures included herein. In view of the present disclosure, other additions, subtractions, or modifications are apparent to a person of ordinary skill in the art and are intended to fall within the scope of the appended claims.

What is claimed is:

1. A semiconductor device, comprising:
   a substrate;
   multi-level interconnections disposed on the substrate;
   a first passivation layer containing a hydrogen rich layer and covering top interconnections among the multi-level interconnections;
   a second passivation layer disposed over the first passivation layer to prevent out-diffusion of hydrogen from the first passivation layer;
   an in-line top dielectric layer over the second passivation layer;
   a hydrogen blocking liner disposed on a sidewall of a through-hole spanning the in-line top dielectric layer, the second passivation layer, and the first passivation layer;
   an in-line redistribution layer connected to one among the top interconnections through the through-hole with the hydrogen blocking liner formed on the sidewall thereof; and
   wherein the substrate includes a device layer having an interface passivated by hydrogen diffused from the first passivation layer,
   wherein the second passivation layer is disposed over the first passivation layer and the device layer,
   wherein the hydrogen blocking liner includes an insulation material.

2. The semiconductor device according to claim 1, wherein the hydrogen blocking liner is vertically extended between the in-line redistribution layer and the second passivation layer.

3. The semiconductor device according to claim 1, wherein the second passivation layer includes silicon nitride.

4. The semiconductor device according to claim 1,
   wherein the first passivation layer includes a hydrogen-containing silicon oxide, and
   wherein each of the hydrogen blocking liner and the second passivation layer includes silicon nitride.

5. The semiconductor device according to claim 1,
   wherein the top interconnections are horizontally spaced apart at a same level, and
   wherein the first passivation layer includes hydrogen-containing silicon oxide and includes air gaps disposed between the top interconnections.

6. The semiconductor device according to claim 1,
   wherein the in-line top dielectric layer includes silicon oxide, and
   wherein the in-line redistribution layer includes aluminum.

7. The semiconductor device according to claim 1, wherein a concentration of hydrogen in the hydrogen rich layer is in a range from 20 at % to 40 at %.

8. The semiconductor device according to claim 1, wherein the in-line redistribution layer is connected to a post-fab conductive layer including solder ball or bump.

* * * * *